United States Patent
Simonian et al.

(10) Patent No.: US 8,203,161 B2
(45) Date of Patent: Jun. 19, 2012

(54) WAVELENGTH CONVERTED SEMICONDUCTOR LIGHT EMITTING DEVICE

(75) Inventors: Dmitri Simonian, Sunnyvale, CA (US); Grigoriy Basin, San Francisco, CA (US)

(73) Assignees: Koninklijke Philips Electronics N.V., Eindhoven (NL); Philips Lumileds Lighting Company LLC, San Jose, CA (US)

(*) Notice: Subject to any disclaimer, the term of this patent is extended or adjusted under 35 U.S.C. 154(b) by 304 days.

(21) Appl. No.: 12/624,156

(22) Filed: Nov. 23, 2009

(65) Prior Publication Data

US 2011/0121331 A1     May 26, 2011

(51) Int. Cl.
*H01L 33/00* (2010.01)
(52) U.S. Cl. .................. 257/98; 257/99; 438/29
(58) Field of Classification Search .......... 257/98, 257/99, E33.067, E33.075; 438/29
See application file for complete search history.

(56) References Cited

U.S. PATENT DOCUMENTS

| | | | |
|---|---|---|---|
| 6,667,548 B2 * | 12/2003 | O'Connor et al. | 257/712 |
| 6,744,951 B2 * | 6/2004 | Dawes et al. | 385/50 |
| 6,870,311 B2 | 3/2005 | Mueller et al. | |
| 7,341,878 B2 | 3/2008 | Krames et al. | |
| 7,344,902 B2 | 3/2008 | Basin et al. | |
| 7,355,284 B2 * | 4/2008 | Negley | 257/778 |
| 7,361,938 B2 | 4/2008 | Mueller et al. | |
| 7,521,862 B2 | 4/2009 | Mueller et al. | |
| 7,868,341 B2 * | 1/2011 | Diana et al. | 257/98 |
| 7,974,508 B2 * | 7/2011 | Lao et al. | 385/131 |
| 2005/0173708 A1 | 8/2005 | Suehiro et al. | |

FOREIGN PATENT DOCUMENTS

| | | |
|---|---|---|
| EP | 1919000 A1 | 5/2008 |
| WO | 2006941178 A2 | 4/2006 |

* cited by examiner

*Primary Examiner* — Phuc Dang

(57) ABSTRACT

A device includes a semiconductor structure comprising a light emitting layer disposed between an n-type region and a p-type region. A luminescent material is positioned in a path of light emitted by the light emitting layer. A thermal coupling material is disposed in a transparent material. The thermal coupling material has a thermal conductivity greater than a thermal conductivity of the transparent material. The thermal coupling material is positioned to dissipate heat from the luminescent material.

19 Claims, 2 Drawing Sheets

WAVELENGTH CONVERTED SEMICONDUCTOR LIGHT EMITTING DEVICE

BACKGROUND

1. Field of Invention

The present invention relates to wavelength-converted semiconductor light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

The wavelength of light emitted by the active region may be shifted by positioning a wavelength converting material such as a phosphor or dye in the path of light emitted by the active region. The wavelength converting material absorbs the light emitted by the active region and emits light at a different peak wavelength which is typically longer than the peak wavelength of light emitted by the active region. FIG. 1 illustrates a wavelength-converted semiconductor light emitting device, described in more detail in U.S. Pat. No. 6,870, 311. In the device of FIG. 1, a light-emitting semiconductor device 32 is disposed in a reflective cup 34. A layer 44 of transparent material 36 is disposed on one or more surface of device 32. Nanoparticles 38 and phosphor particles 40 are dispersed in material 36. Examples of suitable nanoparticles include nanoparticles of metal oxides, nitrides, nitridosilicates, and mixtures thereof. Suitable metal oxides may include, but are not limited to, calcium oxide, cerium oxide, hafnium oxide, titanium oxide, zinc oxide, zirconium oxide, and combinations thereof. Nanoparticles of such metal oxides having sizes ranging, for example, from about 2 nm to about 10 nm are available, for example, from Degussa-Huls AG of Frankfurt/Main Germany. Suitable nanoparticles for such implementations may also include nanoparticles of II-VI semiconductors such as zinc sulfide, zinc selenide, cadmium sulfide, cadmium selenide, cadmium telluride, and their ternary or quaternary mixtures, and nanoparticles of III-V semiconductors such as III-nitrides, III-phosphides, and mixtures thereof. The nanoparticles are chosen to have a refractive index greater than that of the host material.

Transparent material 36 may be organic or inorganic and may comprise, for example, materials including but not limited to conventional epoxies, acrylic polymers, polycarbonates, silicone polymers, optical glasses, chalcogenide glasses, spiro compounds, and mixtures thereof.

Needed in the art are efficient designs for wavelength converted semiconductor light emitting devices.

SUMMARY

It is an object of the invention to provide a device including a luminescent material and a thermal coupling material positioned to dissipate heat from the luminescent material.

In embodiments of the invention, a device includes a semiconductor structure comprising a light emitting layer disposed between an n-type region and a p-type region. A luminescent material is positioned in a path of light emitted by the light emitting layer. A thermal coupling material is disposed in a transparent material. The thermal coupling material has a thermal conductivity greater than a thermal conductivity of the transparent material. The thermal coupling material is positioned to dissipate heat from the luminescent material.

DETAILED DESCRIPTION

Figure 1:
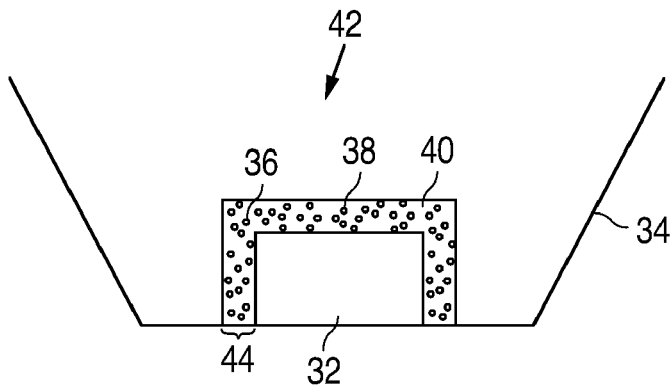
FIG. 1 illustrates a prior art semiconductor light emitting device coated with a transparent material including phosphor particles and nanoparticles.

Wavelength conversion by the phosphor illustrated in FIG. 1 can generate heat, due to, for example, the energy lost in emission of higher wavelength photons, finite conversion efficiency of phosphors, and reabsorption of photons that are not extracted from the device. Heat dissipation from the device of FIG. 1 may be impeded by poor thermal coupling of the phosphor to the device package due to the low thermal conductivity of the transparent material. For example, a silicone transparent material often has a thermal conductivity of about 0.1 to 0.2 W/m-° C. Excessive heat from wavelength conversion may result in operational temperatures high enough to cause decomposition of organic species in the transparent material, which can result in yellowing of the transparent material or even device failure. In addition, quantum efficiencies of some phosphors are reduced at high temperatures, which may undesirably cause a shift in the color point of light emitted by the device or a decrease in light output.

In embodiments of the invention, a thermal coupling material is disposed over a semiconductor light emitting device, to remove heat within and around the wavelength converting material. Heat from the wavelength converting material is dissipated through the thermal coupling material to the light emitting device and a heat sink or mount to which the light emitting device is connected.

The thermal coupling material may be disposed in a transparent host material. One example of a suitable host material is a silicone with a refractive index for visible light between 1.4 and 1.55. Further examples of transparent host materials include organic or inorganic materials such as silicone polymers, epoxies, acrylic polymers, polycarbonates, optical glasses, chalcogenide glasses, and mixtures thereof. High index transparent host materials may also be used, such as high index glasses and materials such as silicones, epoxies, and sol-gels, whose index of refraction has been altered by the addition of nanoparticles, as described in U.S. Pat. No. 6,870,311, which is incorporated herein by reference.

The thermal coupling material may have an index of refraction that is close to or matches the index of refraction of the host material. The index of refraction of thermal coupling material differs from that of the host material by less than 10% in some embodiments and by less than 1% in some embodiments.

The thermal conductivity of the thermal coupling material exceeds that of the host material. For example, the thermal coupling material may have a thermal conductivity greater than 0.5 W/m-° C. in some embodiments, greater than 1 W/m-° C. in some embodiments, and greater than 5 W/m-° C. in some embodiments.

Examples of suitable thermal coupling materials include aluminum/silicon mixed oxides, silica, non-crystalline silica, SiC, AlN, diamond, unactivated phosphor particles such as transparent particles of YAG without Ce doping, and mixtures thereof. Unactivated phosphor particles such as YAG are not wavelength-converting of light emitted by the light emitting device.

The thermal coupling material may be, for example, a powder with a median particle size greater than the median particle size of the phosphor with which it is combined in some embodiments, greater than 1 µm in some embodiments, 5 µm in some embodiments, between 1 µm and 50 µm in some embodiments, between 1 µm and 10 µm in some embodiments, and between 10 µm and 50 µm in some embodiments. Powder phosphors often have a particle size of between 1 µm and 10 µm. The thermal coupling material may be a powder of spherical or close to spherical particles. In some embodiments, the thermal coupling material is positioned such that a substantial fraction of the thermal coupling material particles are in contact with their nearest neighbor particles and form a web. Heat is conducted along the web until it is dissipated into the light emitting device.

Embodiments of the invention are illustrated below. Though the embodiments illustrate III-nitride thin-film flip-chip devices, embodiments of the invention may be used with other devices, such as conventional flip-chip devices where the growth substrate remains part of the finished device, vertical devices where the contacts are formed on opposite sides of the semiconductor structure, devices where light is extracted through contacts formed on the same or opposite sides of the semiconductor structure, and devices made from other materials systems such as, for example, AlInGaP or AlGaAs devices.

The thin-film flip-chip devices illustrated are formed by first growing a semiconductor structure on a growth substrate. The semiconductor structure includes an n-type region, a light emitting or active region, and a p-type region. An n-type region is grown first. The n-type region may include multiple layers of different compositions and dopant concentration including, for example, preparation layers such as buffer layers or nucleation layers, which may be n-type or not intentionally doped, release layers designed to facilitate later release of the substrate or thinning of the semiconductor structure after substrate removal, and n- or even p-type device layers designed for particular optical or electrical properties desirable for the light emitting region to efficiently emit light.

A light emitting or active region is grown over the n-type region. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region is grown over the light emitting region. Like the n-type region, the p-type region may include multiple layers of different composition, thickness, and dopant concentration, including layers that are not intentionally doped, or n-type layers.

A reflective metal p-contact which may be, for example, silver and may include other layers such as guard layers, is formed on the p-type region. Portions of the p-contact, the p-type region, and the light emitting region of the semiconductor structure are etched away to expose portions of the n-type region. N-contacts are formed on the exposed portions of the n-type region.

The LED 50 is bonded to a support by n- and p-interconnects, which may be any suitable material, such as solder, Au, Au/Sn or other metals, and may include multiple layers of materials. In some embodiments, interconnects include at least one gold layer and the bond between the LED and the mount 54 is formed by ultrasonic bonding.

After bonding the LED die to the support, all or part of the substrate on which the semiconductor layers were grown may be removed. The semiconductor structure remaining after removing the host substrate may be thinned, for example by photoelectrochemical etching. The semiconductor surface may be roughened or patterned, for example with a photonic crystal structure. The LED 50 may then be attached to a mount 54, which may be the support, or a separate structure on which the support is mounted. An optional device 52, which may be, for example, an ESD protection circuit or other circuit, often formed as a conventional silicon integrated circuit, may be attached to the mount 54 or integrated into mount 54.

In the embodiments described below, a thermal coupling material and one or more wavelength converting materials, typically phosphors, are combined with a III-nitride LED. More or fewer wavelength converting materials may be used, and non-phosphor wavelength converting materials such as dyes or quantum dots may be used. The wavelength converting materials may convert all of the light from the LED to form monochromatic colored light or white light, or the wavelength converting materials may be configured such that some light emitted by the LED escapes the structure unconverted. In some embodiments, unconverted and wavelength-converted light combine to form white light. For example, a blue-emitting LED may be combined with a yellow-emitting phosphor, or a blue-emitting LED may be combined with a red-emitting phosphor and a yellow- or green-emitting phosphor. Other phosphors emitting light of other colors may be added to achieve a desired color point.

Phosphors are well known and any suitable phosphor may be used. Examples of suitable red-emitting phosphors include eCAS, BSSNE, SSONE, as well as $(Ca_{1-x}Sr_x)S:Eu^{2+}$ wherein $0<x\leq1$ including, for example, $CaS:Eu^{2+}$ and $SrS:Eu^{2+}$; and $(Sr_{1-x-y}Ba_xCa_y)_{2-z}Si_{5-a}Al_aN_{8-a}O_a:Eu_z^{2+}$ wherein $0\leq a<5$, $0<x\leq1$, $0\leq y\leq1$, and $0<z\leq1$ including, for example, $Sr_2Si_5N_8:Eu^{2+}$. eCAS, which is $Ca_{1-x}AlSiN_3:Eu_x$ may be synthesized from 5.436 g $Ca_3N_2$ (>98% purity), 4.099 g AlN (99%), 4.732 g $Si_3N_4$ (>98% purity) and 0.176 g $Eu_2O_3$ (99.99% purity). The powders are mixed by planetary ball milling, and fired for 4 hours at 1500° C. in $H_2/N_2$ (5/95%) atmosphere. BSSNE, which is $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$), may be synthesized by carbothermal reduction, which includes mixing 60 g $BaCO_3$, 11.221 g $SrCO_3$ and 1.672 g $Eu_2O_3$ (all 99.99% purity) by planetary ball milling using 2-propanol as dispersing agent. After drying, the mixture is fired in forming gas atmosphere at 1000° C. for 4 hours and 10 g of the thus obtained $Ba_{0.8}Sr_{0.2}O:Eu$ (2%) are mixed with 5.846 g $Si_3N_4$ (>98% purity), 0.056 g AlN (99% purity) and 1.060 g graphite (microcrystal grade). The powders are thoroughly mixed by 20 minutes of planetary ball milling and fired for 4 hours at 1450° C. in a forming gas atmosphere to obtain a powder of $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$). SSONE may be manufactured by mixing 80.36 g $SrCO_3$ (99.99% purity), 20.0 g $SiN_{4/3}$ (>98% purity) and 2.28 g $Eu_2O_3$ (99.99% purity) and firing at 1200° C. for 4 hour in a $N_2/H_2$ (93/7) atmosphere.

Examples of suitable yellow/green emitting phosphors include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$; $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; and $Sr_{1-x}Ba_xSiO_4:Eu^{2+}$. A suitable $Y_3Al_5O_{12}:Ce^{3+}$ ceramic may be produced as follows: 40 g $Y_2O_3$ (99.998%), 32 g $Al_2O_3$ (99.999%), and 3.44 g $CeO_2$ are milled with 1.5 kg high purity alumina balls (2 mm diameter) in isopropanol on a roller bench for 12 hrs. The dried precursor powder is then calcined at 1300° C. for two hours under CO atmosphere. The YAG powder obtained is then deagglomerated with a planet ball mill (agate balls) under ethanol. The ceramic slurry is then slip casted to obtain a ceramic green body after drying. The green bodies are then sintered between graphite plates at 1700° C. for two hours.

Figure 2:
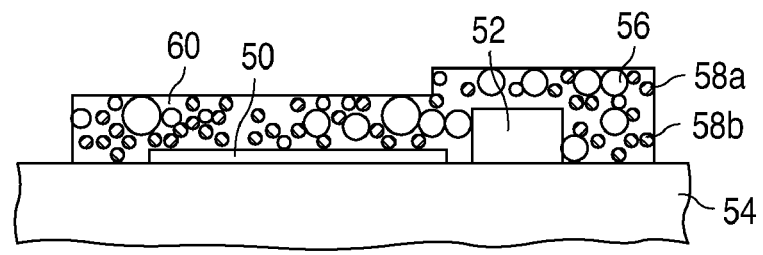
FIG. 2 illustrates a transparent material including phosphors and a thermal coupling material disposed over a light emitting device.

In the embodiment illustrated in FIG. 2, a thermal coupling material 56 is mixed with powder phosphors 58a and 58b and disposed in a transparent host material 60. The mixture may be dispensed over LED 50 in liquid or slurry form, then cured. For example, the mixture may be molded over the LED 50 as described in U.S. Pat. No. 7,344,902, titled "Overmolded Lens Over LED Die" and incorporated herein by reference. Or, a film containing the phosphors and the thermal coupling material may be formed separately from the LED, then positioned over the LED 50. Other examples of forming a mixture of phosphor and transparent host material over an LED include lamination or gluing down such mixture formed separately as a film, screen printing of such mixture, or a knife-edge deposition of such mixture. In an alternative embodiment, only one type of powder phosphor 58a may be present in the mixture.

Figure 3:
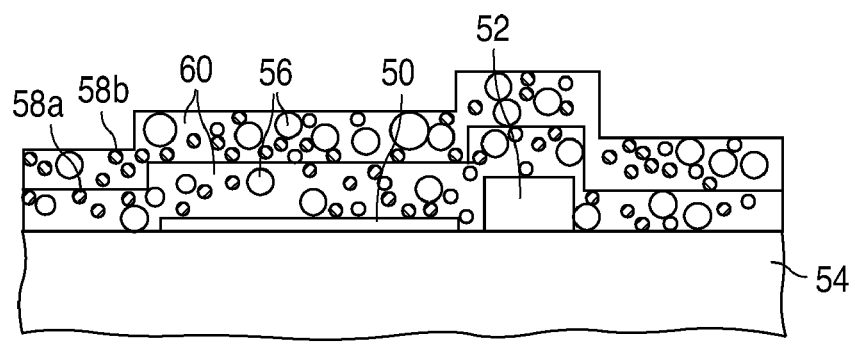
FIG. 3 illustrates two discrete layers, each including a transparent material, a phosphor, and a thermal coupling material, disposed over a light emitting device.

In the embodiment illustrated in FIG. 3, the two phosphors are separated and disposed over the LED as discrete layers. Each phosphor is mixed with thermal coupling material 56 and a transparent binding material 60. In some embodiments, thermal coupling material 56 may be included in just one of multiple phosphor layers, or in a separate layer of host material with no phosphor. Discrete layers may be formed by different methods, which include but are not limited to: lamination, gluing down, screen printing, knife-edge deposition.

In the devices of FIGS. 2 and 3, the combined volume of phosphors and thermal coupling material may be at least 30% of the total volume of phosphor, thermal coupling material, and host material in some embodiments, and at least 60% of the total volume of phosphor, thermal coupling material, and host material in some embodiments. The ratio by weight of yellow or green emitting phosphor:red emitting phosphor: transparent material:thermal coupling material may be 3.67: 1.33:7:3 in one example, 3.67:1.33:8:2 in one example, and 3.67:1.33:5:5 in one example.

Figure 4:
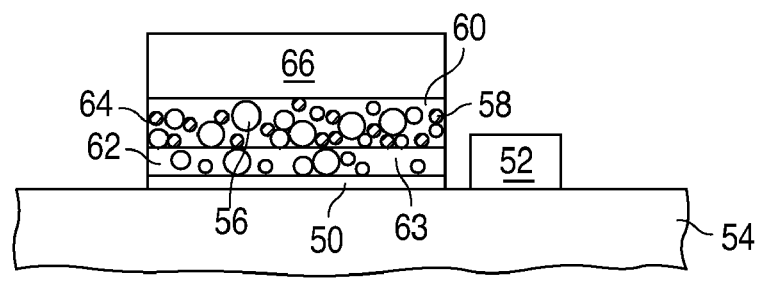
FIG. 4 illustrates a multilayer device including a ceramic phosphor, a layer of transparent material including a phosphor and a thermal coupling material, and a glue layer including a thermal coupling material disposed on a light emitting device.

The device illustrated in FIG. 4 includes a thermal coupling material and a luminescent ceramic or ceramic phosphor 66. Ceramic phosphors are described in more detail in U.S. Pat. No. 7,361,938, which is incorporated herein by reference. Ceramic phosphor 66 may be pre-formed into a plate independent of the processing of LED 50, then glued to LED 50 by adhesive layer 62 including a transparent adhesive 63. Thermal coupling material 56 may be mixed with transparent adhesive 63 in adhesive layer 62.

An optional second phosphor layer 64 is disposed between ceramic phosphor 66 and die 50. Optional second phosphor layer 64 may be, for example, a powder phosphor 58 mixed with a transparent host 60 as described above, then applied and cured on the bottom surface of ceramic phosphor 66. Thermal coupling material 56 may be mixed with phosphor 58 in host material 60, though it need not be. In the device illustrated in FIG. 4, thermal coupling material 56 may be disposed in only one or in both of adhesive layer 62 and second phosphor layer 64. In some embodiments, if the host material 60 in phosphor layer 64 is suitable for attaching ceramic phosphor 66 to die 50, a separate adhesive layer 62 may be omitted.

Figure 5:
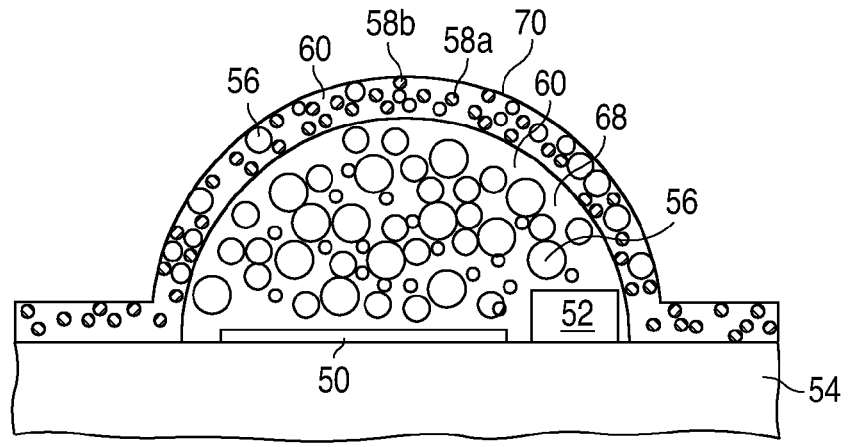
FIG. 5 illustrates a phosphor layer and a lens filled with thermal coupling material disposed over a light emitting device.

In the device of FIG. 5, an optical element such as a lens is formed over LED 50. Lens 68 may be formed from, for example, silicone or any other suitable transparent material 60. The volume of thermal coupling material may be at least 30% of the total volume of thermal coupling material and transparent host material in some embodiments and at least 60% of the total volume of thermal coupling material and transparent host material in some embodiments. A luminescent layer 70 may be formed over lens 68. Luminescent layer 70 may include one or more phosphors 58a and 58b disposed in a transparent host material 60. One or both of lens 68 and luminescent layer 70 may include thermal coupling material 56.

Figure 6:
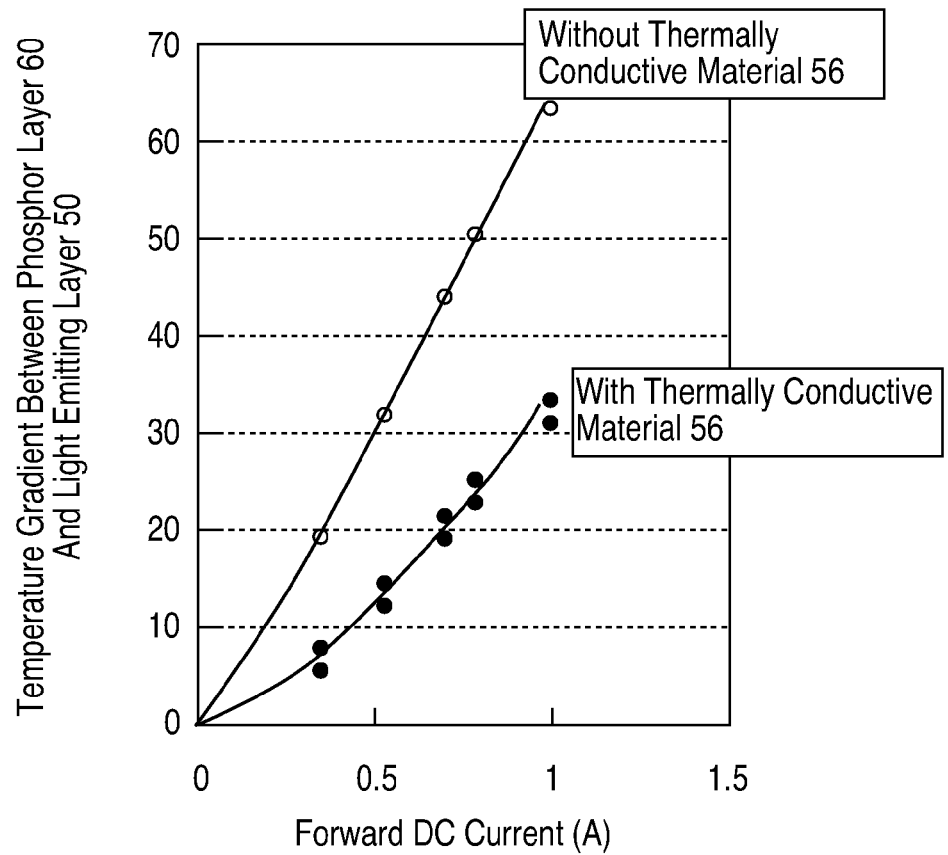
FIG. 6 illustrates the temperature gradient between the light emitting layer and a phosphor layer as function of forward current for devices with and without thermal coupling materials.

FIG. 6 illustrates the temperature gradient between the light emitting layer and a phosphor layer as function of forward current for devices with and without thermal coupling materials. In the devices illustrated in FIG. 6, a mixture of LuAG and Europium-doped $(Ca_{0.2}Sr_{0.8})AlSiN_3$ phosphors was disposed in a silicone host material and disposed over a thin film flip chip device. The filled-in circles illustrate a device with a thermal coupling material disposed in the host material, according to embodiments of the invention. The open circles illustrate a device without a thermal coupling material. As illustrated in FIG. 6, at all forward current values, the temperature gradient is smaller for the device including a thermal coupling material, indicating that the thermal coupling material dissipates heat from the phosphor, while not causing a decrease in light output from the device, at all forward currents.

In some embodiments, particles of transparent material are mixed with phosphor powder in a transparent host material. The transparent material particles have an index of refraction matched or close to that of the host material and are positioned to prevent sedimentation of phosphor in the host material. The combined volume of transparent material particles may be at least 0.1% of the total volume of phosphor, transparent material particles, and host material in some embodiments; at least 1% of the total volume of phosphor, transparent material particles, and host material in some embodiments; and at least 20% of the total volume of phosphor, transparent material particles, and host material in some embodiments. The particles of transparent material may be, for example, a powder with a median particle size of between 0.1 µm and 5 µm in some embodiments, between 1 µm and 10 µm in some embodiments, and between 10 µm and 50 µm in some embodiments. The particles of transparent material are usually spherical or close to spherical in shape.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a semiconductor structure comprising a light emitting layer;
   a luminescent material positioned in a path of light emitted by the light emitting layer; and
   a thermal coupling material disposed in a transparent material; wherein:
   the thermal coupling material is non-wavelength converting of light emitted by the light emitting layer;
   the thermal coupling material has a thermal conductivity greater than a thermal conductivity of the transparent material;
   the thermal coupling material is positioned to dissipate heat from the luminescent material;
   the thermal coupling material comprises particles having a median particle size greater than 10 µm; and
   an index of refraction of the thermal coupling material differs from an index of refraction of the transparent material by less than 10%.

2. The device of claim 1 wherein the luminescent material is a powder phosphor disposed in the transparent material.

3. The device of claim 1 wherein:
   the luminescent material is a first luminescent material configured to emit light at a first peak wavelength;
   the device further comprises a second luminescent material configured to emit light at a second peak wavelength; and
   the first and second luminescent materials are mixed and disposed in the transparent material.

4. The device of claim 1 wherein:
   the luminescent material is a first luminescent material configured to emit light at a first peak wavelength;
   the device further comprises a second luminescent material configured to emit light at a second peak wavelength; and
   the first and second luminescent materials are disposed in transparent material and positioned over the semiconductor structure in discrete layers.

5. The device of claim 1 wherein the luminescent material is a ceramic phosphor.

6. The device of claim 1 further comprising a powder phosphor disposed in the transparent material.

7. The device of claim 1 wherein the transparent material is formed into a lens and the transparent material is disposed between the semiconductor structure and the luminescent material.

8. The device of claim 1 wherein the light emitting layer is a III-nitride material.

9. The device of claim 1 wherein the thermal coupling material has a thermal conductivity of at least 5 W/m-° C.

10. The device of claim 1 wherein the thermal coupling material comprises a powder with a median particle size of between 10 µm and 50 µm.

11. The device of claim 1 wherein the thermal coupling material comprises a powder, wherein at least a portion of the thermal coupling material particles are in direct contact with nearest neighbor particles and form a thermally conductive path to the semiconductor structure.

12. The device of claim 1, wherein a density of the thermal coupling material is sufficient to assure that a substantial majority of the thermal material particles are in contact with each other.

13. The device of claim 1, wherein a ratio of the thermal coupling material compared to the transparent material by weight is at least 1.5:1.

14. The device of claim 1, wherein a ratio of the thermal coupling material compared to the luminescent material by weight is at least 4:1.

15. A method comprising:
    providing a semiconductor structure comprising a light emitting layer;
    positioning a luminescent material in a path of light emitted by the light emitting layer; and
    positioning a thermal coupling material disposed in a transparent material to dissipate heat from the luminescent material;
    wherein:
    the thermal coupling material is non-wavelength converting of light emitted by the light emitting layer;
    the thermal coupling material has a thermal conductivity greater than a thermal conductivity of the transparent material;
    the thermal coupling material comprises particles having a median particle size greater than 10 µm; and
    an index of refraction of the thermal coupling material differs from an index of refraction of the transparent material by less than 10%.

16. The method of claim 15 wherein the luminescent material is a ceramic phosphor.

17. The method of claim 15, wherein a density of the thermal coupling material is sufficient to assure that a substantial majority of the thermal material particles are in contact with each other.

18. The method of claim 15, wherein a ratio of the thermal coupling material compared to the transparent material by weight is at least 1.5:1.

19. The method of claim 15, wherein a ratio of the thermal coupling material compared to the luminescent material by weight is at least 4:1.

* * * * *